United States Patent [19]

Pack

[11] Patent Number: 5,396,504
[45] Date of Patent: Mar. 7, 1995

[54] ERROR CORRECTION SYSTEM OF DIGITAL DATA

[75] Inventor: Seung K. Pack, Seoul, Rep. of Korea

[73] Assignee: Samsung Electronics Co., Ltd., Rep. of Korea

[21] Appl. No.: 810,879

[22] Filed: Dec. 20, 1991

[30] Foreign Application Priority Data

Jun. 29, 1991 [KR] Rep. of Korea ............... 91-11114

[51] Int. Cl.⁶ .................. G06F 11/10; H03M 13/00
[52] U.S. Cl. .................... 371/374; 371/38.1; 371/39.1
[58] Field of Search .......... 371/37.4, 37.1, 37.2, 371/37.5, 37.8, 38.1, 39.1, 2.2, 40.1, 40.2, 41, 50.1, 37.3, 30, 2.1, 72

[56] References Cited

U.S. PATENT DOCUMENTS

| | | | |
|---|---|---|---|
| 4,357,702 | 11/1982 | Chase et al. | 371/1 |
| 4,653,052 | 3/1987 | Doi et al. | 371/38 |
| 4,742,519 | 5/1988 | Abe et al. | 371/38 |
| 4,882,732 | 11/1989 | Kaminaga | 371/2.2 |
| 5,038,350 | 8/1991 | Mester | 371/37.4 |
| 5,070,503 | 12/1991 | Shikakura | 371/37.1 |
| 5,161,171 | 11/1992 | Suzuki et al. | 375/108 |

Primary Examiner—Robert W. Beausoliel, Jr.
Assistant Examiner—Dieu-Minh Le
Attorney, Agent, or Firm—Reed Smith Shaw & McClay

[57] ABSTRACT

An error correction system of digital data for use in a digital VTR or a digital TV constituted as parts of a digital processing system, which is provided with an ECC outer encoder, a shuffling means, an inner encoder, a tape, an ECC inner decoder, a de-shuffling means and an ECC outer decoder to perform the double encoding/decoding, comprises a memory address generating circuit for enabling the de-shuffling portion to generate addresses increasing toward the column from the first address of write addresses, a de-shuffling memory circuit for storing data and error flags and a path control circuit for controlling the input/output of data and error flag memories. Thus, it makes use of an ID signal identifying the position information of data recorded on a tape and an error flag confirming whether the reproduced data is error or not, so that it controls the write addresses and input/output paths of the data and error flag memories to minimize the loss of recorded data, thereby improving the quality of the image to be reproduced.

1 Claim, 4 Drawing Sheets (a) ERROR FLAG IN CASE OF ERROR OCCURRENCE OF CODE 0

(b) ERROR FLAG IN CASE OF ERROR OCCURRENCE OF CODE 1

| OPERATING MODE | | | | CONTROL SIGNAL | | | | | | | | | |
|---|---|---|---|---|---|---|---|---|---|---|---|---|---|
| M1 | M2 | M3 | M4 | FRAME | F_SEL | EA1 | EB1 | EA2 | EB2 | EA3 | EB3 | EA4 | EB4 |
| W | $W_H$ | R | X | L | L | L | H | H | H | H | L | H | H |
| R | X | $W_H$ | W | L | H | H | L | H | H | H | H | L | H |
| $W_H$ | W | X | R | H | L | H | H | L | H | H | H | H | L |
| X | R | W | $W_H$ | H | H | H | H | H | L | L | H | H | H |

W: WRITE & WRITE ADDRESS      $W_H$: WRITE & READ ADDRESS
R: READ AND READ ADDRESS      X: DON'T CARE

ERROR CORRECTION SYSTEM OF DIGITAL DATA

BACKGROUND OF INVENTION

1. Field of the Invention

The present invention relates to an error correction system of digital data for use in a digital data processing system such as a digital VTR and a digital TV, etc.. More particularly, the present invention is directed to an error correction system improving the display of a reproducing image, in a manner which the synchronizing detection errors due to the instability of synchronizing signals are minimized, when the data reproduction from a tape is performed using an ID (Identifying) error flag, and error data reproduced with a variable speed mode, for example a shuttle mode and a de-shuttle mode, is substituted for the previous field data free from errors.

2. Description of the Prior Art

A conventional digital video tape recorder (VTR) makes a synchronizing detection error due to the instability of a synchronizing signal during reproducing data from a tape. It causes all reproducing data to be wrong in the timing, thereby resulting in processing data different from data recorded in the middle of processing data after the synchronizing detection. At the reproduction of a shuttle mode or a de-shuttle mode, only parts of a tape are restored without errors, or all data recorded happens to make many errors because of the staggering of a reproducing order differing from an original status.

Typically, U.S. Pat. No. 4,799,113 describes an apparatus for processing digital data as reproduced by a digital tape recorder includes a first memory in which words or blocks of reproduced digital data written in accordance with respective write address and from which the words of written data are read out in response to read addresses selected for de-shuffling or de-interleaving of the reproduced data and a second memory storing, at addresses corresponding to the write addresses at which the words of digital data are written in the first memory, data, such as error flags, indicating the state of such words of digital data. It also occurs much loss of reproducing data from the first memory during operating of the concealment or the interpolation due to the instability of a synchronizing signal.

The object of the present invention is to improve a reproducing picture or image, making use of an ID and an error flag to generate write addresses so as to store them in a reshuffling memory while applying the same addresses to a flag memory so as to store them therein.

Another object of the present invention is to provide an error correction system of digital data for substituting an error field for a field not having errors.

Still another object of the present invention is to provide an error correction system of digital data for minimizing synchronizing detection errors as well as for preventing the staggering of the timing between data and control signals.

Yet another object of the present invention is to provide an error correction system of digital data for requiring a small number of the data and error flag storing memories without an additional circuit.

SUMMARY OF THE INVENTION

The present invention is directed to an error correction system of digital data for use in a digital VTR or a digital TV constituted as parts of a digital processing system, which is provided with an ECC outer encoder, a shuffling means, an inner encoder, a tape, an ECC inner decoder, a de-shuffling means and an ECC outer decoder to perform the double encoding/decoding operation, wherein the error correction system comprises a memory address generating circuit for enabling the de-shuffling means to generate addresses increasing toward the column from the first addresses of write addresses, a de-shuffling memory circuit for storing data and error flags and a path control circuit for controlling the input/output of data and error flag memories.

Thus, the present invention makes the field memory generate write addresses by using an ID byte(including 10 bits) indicating the position information of data recorded on a tape and error flags confirming whether the reproduced data is an error or not, so that it controls write addresses and input/output paths of the data and error flag memories to minimize the loss of recorded data, thereby improving the quality of the image to be reproduced.

In other words, during reproducing data from a tape the error correction system minimizes the synchronizing detection errors and replaces the error data by the error free data in a shuttling or de-shuttling mode.

BRIEF DESCRIPTION OF THE DRAWINGS

The present invention will be explained in detail below with reference to the accompanying drawings, in which.

DETAILED DESCRIPTION OF PREFERRED EMBODIMENTS

Generally, a system for processing digital data such as a digital VTR and a digital TV is used to minimize errors generated from a tape or a channel during transmitting and/or receiving data, but it has problems as described the above to be able to resolve the present invention.

Figure 1:
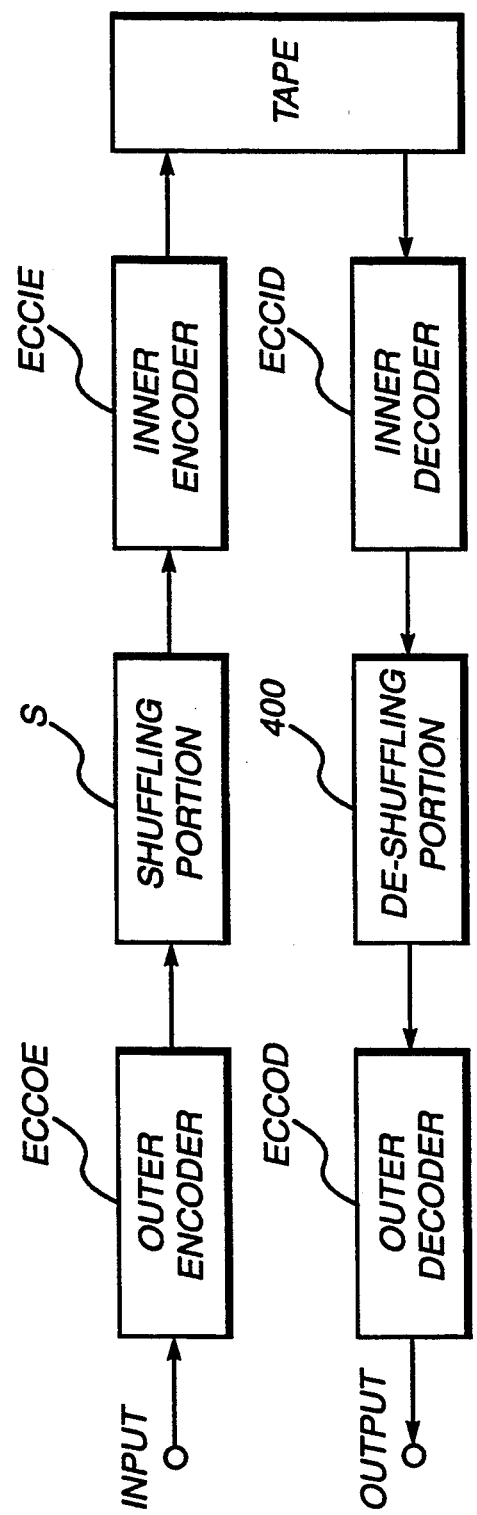
FIG. 1 is a block diagram illustrating an error correction system according to the present invention.

Referring to FIG. 1, a double encoding (Product Code) configuration includes an outer encoder ECCOE and an inner encoder ECCID to perform the error correction in twice. A shuffling portion S and a de-shuffling portion 400 are arranged in order of the input/output of data to minimize burst errors.

Figure 2:
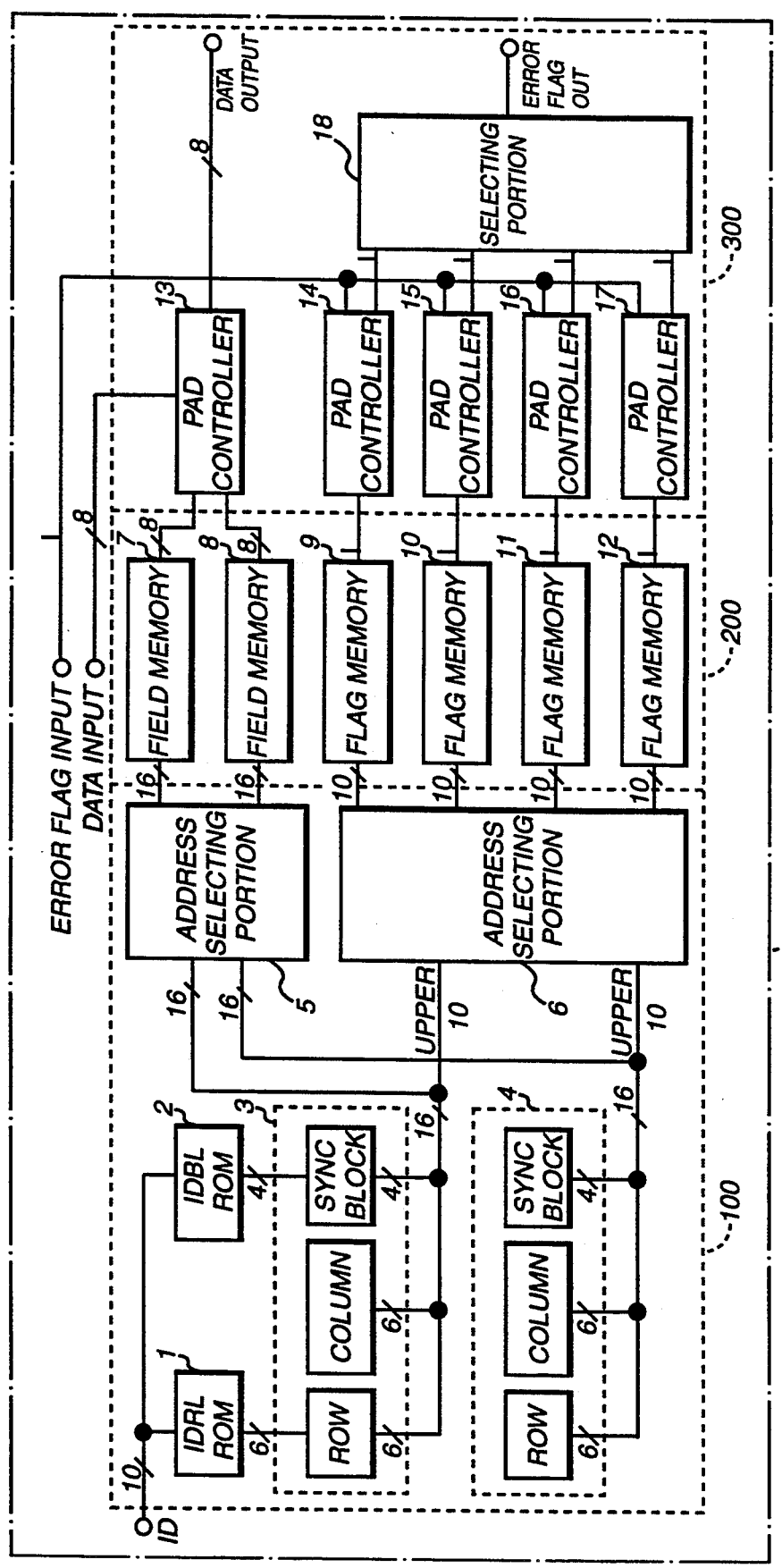
FIG. 2 is a detailed block diagram illustrating a de-shuffling portion of FIG. 1.

FIG. 2 is a detailed block diagram corresponding to a de-shuffling portion S of FIG. 1. The de-shuffling portion S is provided with a memory address generating circuit 100, a de-shuffling memory circuit 200 and a path control circuit 300 for controlling the input/output of a data memory, wherein the memory address generating circuit 100 includes an IDRL ROM 1 converting an ID byte into the value to be loaded into a write address generating portion 3, a read address generating portion 4 and an address selecting portions 5 and 6, the de-shuffling circuit 200 includes field memories 7 and 8 for storing data and flag memories 10, 11, and 12 for storing error flags, and the path control circuit 300 contains a first path control portion 13 for controlling the input/output of a data memory, second path controls 14, 15, 16 and 17 for controlling the input/output of an error flag memory and a selecting portion 18 for selecting the output of error flags.

Therefore, The ECC (Error Correction Code) inner decoder outputs the signals firstly correcting data and error flag inputs to apply them to the path control portions 14, 15, 16 and 17, respectively. The data input (DATA IN) includes Sync. Block units as seen in FIG. 8, each of which can be divided into inner codes 0 and 1. The inner code 0 contains ID of two bytes, data of 45 bytes and 8 bit parity, and the inner code 1 has data of 45 bytes and 8 bit parity.

An ID input indicates the position where the synchronizing block SYNC. BLOCK has been recorded on a tape TAPE, which is inputted to the IDRL ROM 1 and the IDBL ROM 2. The IDRL ROM 1 and the IDBL ROM 2 converts the ID input into a counter load (Counter Load) value. That is, the ID value is passed through the IDRL ROM 1 and the IDBL ROM 2 to convert the synchronizing block SYNC. BLOCK into the start address of write addresses to be stored in the field memories 7 and 8 of the de-shuffling memory circuit 200.

The write address generating portion 3 generates addresses increasing toward the column from the start address of write addresses in order, stores one synchronizing block SYNC. BLOCK and then repeats the above procedure using the ID signal to be continued in next.

Also, provided that an error flag input (ERROR FLAG IN) is the high level signal "H", the write address generation is stopped not storing data in the field memories 7 and 8. Otherwise, in case that an error is occurred in an inner code (INNER CODE) 0 among a synchronizing block SYNC. BLOCK, an error flag input (ERROR FLAG IN) over the total synchronizing block is made into the high level signal "H" due to the lack of reliability as to the ID value, and all the inner codes (INNER CODE) 0 and 1 are not stored in the field memories 7 and 8. If an error is caused only in the inner code (INNER CODE) 1, only the inner code (INNER CODE) 0 is stored in the field memories 7 and 8.

Figure 3:
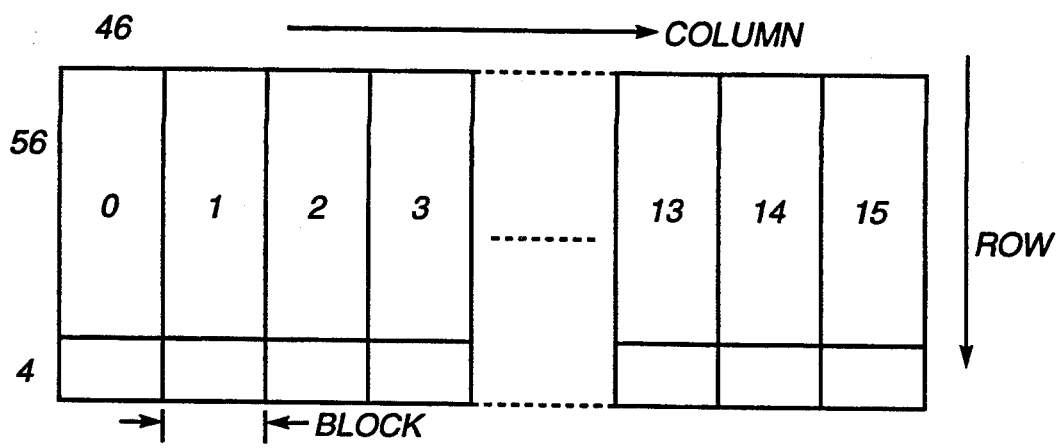
FIG. 3 is a view showing the exactly positions of data stored in a de-shuffling memory map.

Herein, it is noted that the read address generation using the ID value gets data to be stored at the exact position of a de-shuffling memory as seen in FIG. 3, which will be described in detail later. Thus, even though the order of data reproduced in a shuttle or de-shuttle mode is differed from that of data recorded, its correction is performed in the de-shuffling memory circuit 200 while the error data being not stored in the memories to be substituted for the error free data, thereby improving the reproducing picture quality.

FIG. 3 is a view showing the exactly storing positions of data in a de-shuffling map. The de-shuffling map stores the inner codes of 46 bytes except for an 8 bit parity toward 16 columns and 58 low direction. Thus, the low address of write addresses and read addresses is 6 bit, a column address is 6 bit and a block address is 4 bit, wherein the write addresses are generated by using ID error flags, but the read addresses are generated in a manner to firstly vary toward the low direction and then to increase toward the column direction in order.

Figure 4:
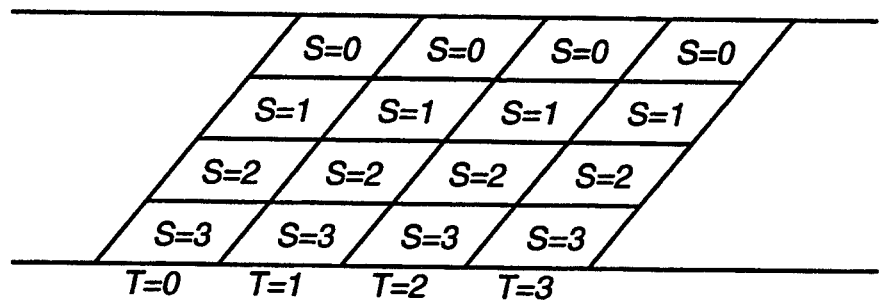
FIG. 4 is a view illustrating the configuration of track segments on a recording/reproducing tape.

FIG. 4 is showing the recording position of a tape corresponding to one field. One field contains four tracks $T_0$-$T_4$, one of which has four segments. It is noted that one segment includes 58 * 46 bytes compared to FIG. 3. For this, the addresses of the de-shuffling memory map can be generated by using the ID considered as the recording position of a tape.

Referring again to FIG. 2, the selecting portions 5 and 6 respectively switch the field memories 7 and 8 to store data therein and select write addresses to be read out and read addresses. The path controls 13, 14, 15, 16 and 17 control the read/write paths of data.

Hitherto, the storing and reading out operation of data has been explained as above, and furthermore the error correction system must store error flags in addition to data which will be set forth below.

The ECC outer decoder ECCOD corrects errors using error flags as seen in FIG. 1. The flag memories 9, 10, 11 and 12 store error flags. The inner codes or synchronizing blocks having an error are not stored in the field memories as described above, but error flags must be stored in a flag memory to enable the ECC outer decoder ECCOD to discriminate the error generating position. Therefore, the flag memory control must be performed in the way different from the field memory one.

Figures 6, 7:
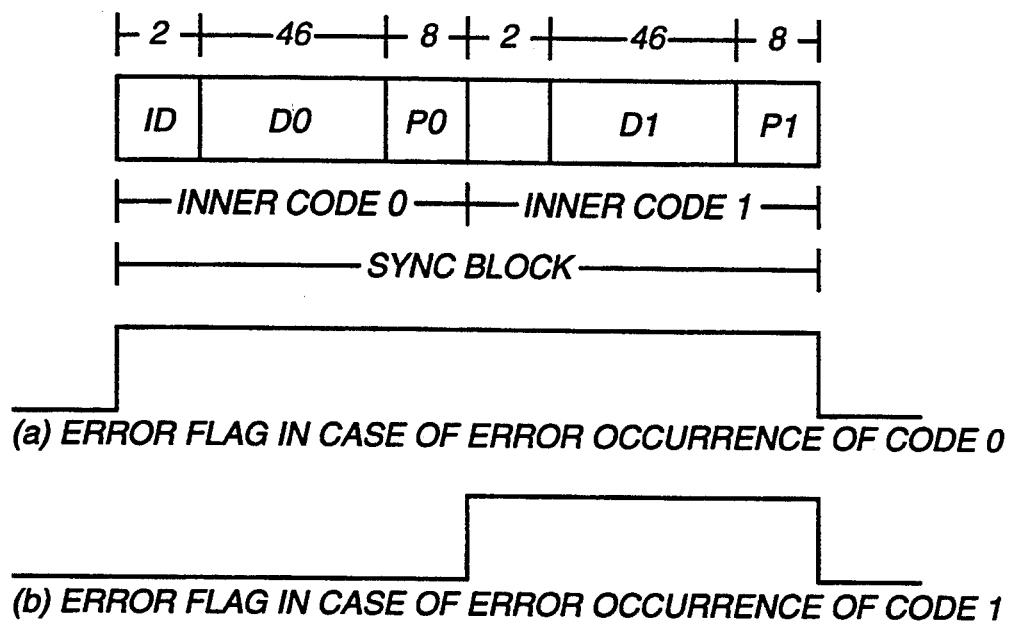
FIG. 6 is a view illustrating the correlation between IDs and EFs (Error Flags) of FIG. 2; and, FIG. 7 is a view showing a control signal requiring for the synchronization of an error flag memory and a path control.

An control signal necessary for the path control regrading the operation mode of a flag memory is shown in FIG. 7. An error flag is represented as the "H" or "L" of an inner code unit to use only 10 bit address except for the 16 bit column address used in a field memory. The field memory can be switched only by a signal $F_{13}SEL$ for identifying the field memory, but the flag memory needs a frame signal for identifying the corresponding frame. Also, the flag memory occupies the address of the field memory in common with its address. Due to it, write addresses are not generated for preventing the storing of data at the time of the error occurrence. In this case, the error flag must be stored in the flag memory and needs the frame signal unlike the field memory. If the addresses of the field and flag memories are not owned in common while write addresses being generated during the error occurrence, the frame signal is no more required thereby to reduce the flag memory by two. In this case, assumed that write addresses are generated using the ID of the low reliability nevertheless occurring of errors, write addresses corresponding to error free data may make errors resulting in the heavy loss of data. Therefore, to switch four flag memories using the frame signal is to minimize the loss of data caused by making an error.

The memory switching operation is performed as shown in FIG. 7. That is to say, if the control signals FRAME and $F_{13}SEL$ are "L", the flag memory 9 receives write addresses to store error flags. If the error flag input (ERROR FLAG IN) is "H", write addresses are not generated. Consequently, what the flag memory stores is only error flags, when the error flag input is "L". But, in the area not generating write addresses there are stored data of "H" because data of "H" is stored in all area of the memory using read addresses which increase in order during the period of the operation mode $W_H$ (the control signal FRAME is "H", and the control signal $F_{13}SEL$ is "L") followed by the operation mode W. When the control signal FRAME and F$_{13}$SEL are respectively "L" and "H", the flag memory reads out error flags using read addresses. Therefore, each of the flag memory selects the operation mode in order of W$_H$-W-R to write/read out error flags. The path controls 14, 15, 16 and 17 control the input/output of the flag memory to correspond to the operation mode, the inner configuration of which is the same as that of FIG. 5.

Figure 5:
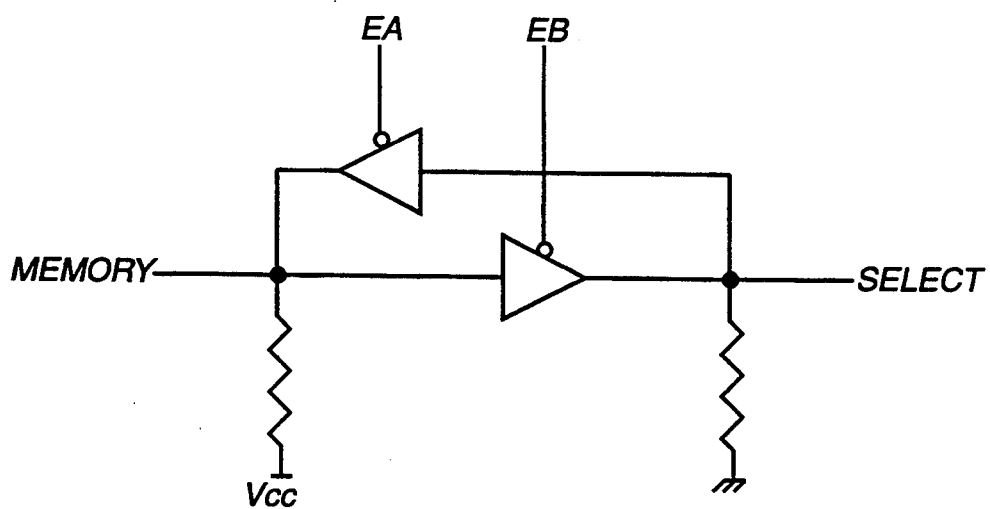
FIG. 5 is a view illustrating the inner configuration of path control portions in FIG. 2.

As shown in FIG. 5, if a gate EA receives the signal "L", error flags are stored in a flag memory. If a gate EB is the signal "L", error flags are read out from a flag memory. Also, when the gates EA and EB are the signal "H", the signal "H" is stored in a field memory during the period of the operation mode W$_H$. The control signals of each of the operation mode are illustrated in FIG. 7.

As described above, the present invention makes use of an ID and an error flag to generate write addresses for storing at a reshuffling memory while applying the same addresses to a flag memory to store them therein. Therefore, firstly it can corrects the error state that the reproducing data became different from the order of the recorded data as well as substitutes an error field for a field free from errors in a shuttle or de-shuttle mode. Secondly, it can not only minimizes synchronizing detection errors but also remove the timing staggering between data and control signals. Thirdly, it needs two memories of $2^{16} * 8$ bits for storing data and four memories of $2^{10} * 4$ for storing error flags. Thus, the present invention requires a small number of the data and error flag storing memories without an additional circuit.

What is claimed is:

1. An error correction system comprising:

a means for performing a double encoding operation and shuffling of input digital picture data and for recording the data in a tape with an additional Identifying (ID) signal;

an error correction code (ECC) inner decoder for reading the data recorded in the tape by sync block, for performing an error correction, for detecting the ID signal from the read sync block and for generating error flags; and a de-shuffling means for performing shuffling of data generated from the ECC inner decoder, said de-shuffling means including:

a de-shuffling memory means for storing the data and the error flags provided from the ECC inner decoder, said de-shuffling memory means including first to fourth error flag memories for storing the error flags, a memory controlling means for controlling input and output of the de-shuffling memory means, said memory controlling means being operable to generate a first selecting signal (F$_{13}$SEL) and a second selecting signal (FRAME) and a first to an eighth controlling signal (EA1, EB1, EA2, EB2, EA3, EB3, EA4, EB4), and a memory address generating means having a write address generating portion for generating write addresses for writing the data provided from the ECC inner decoder in the de-shuffling memory means, a read address generating portion for generating read addresses for reading data from the de-shuffling memory means, a first address selecting portion and a second address selecting portion for outputting selectively one of the outputs from the address generating portions, wherein said memory address generating means includes a means for generating an initial value of row address and block address of the write address for recording input data in the de-shuffling means in response to the ID signal and providing the initial value to the write address generating portion, and wherein said first and said second address selecting portions select one of the outputs of the write and the read address generating portions in response to the first selecting signal (F$_{13}$SEL) and the second selecting signal (FRAME) and provide the selected output to one of the four error flag memories, and wherein said memory controlling means are connected with the first to the fourth error flag-memories respectively, said memory controlling means including first to fourth path controllers which provide either a write path for writing the error flags at the write address or at the read address of the first to the fourth error flag memories or a read path for reading the error flags from the read address of the first to the fourth error flag memories, and an output selecting portion for selecting one of the outputs from the first to the fourth path controllers.

* * * * *